United States Patent [19]
Pelgrom et al.

[11] Patent Number: 4,766,332
[45] Date of Patent: Aug. 23, 1988

[54] DETECTING BINARY INFORMATION FROM A CHARGE TRANSFER DEVICE

[75] Inventors: Marcellinus J. M. Pelgrom; Hendrik A. Harwig; Jan W. Slotboom, all of Eindhoven, Netherlands

[73] Assignee: U.S. Philips Corporation, New York, N.Y.

[21] Appl. No.: 704,891

[22] Filed: Feb. 22, 1985

Related U.S. Application Data

[63] Continuation of Ser. No. 409,206, Aug. 18, 1982, abandoned.

[30] Foreign Application Priority Data

Sep. 8, 1981 [NL] Netherlands ............................ 8104154

[51] Int. Cl.[4] .............................................. H03K 5/24
[52] U.S. Cl. ..................................... 307/358; 307/353; 307/443; 357/24; 382/50
[58] Field of Search ............... 307/350, 352, 353, 358, 307/359, 443; 328/164; 357/24; 382/50, 53

[56] References Cited

U.S. PATENT DOCUMENTS

| | | | |
|---|---|---|---|
| 3,955,101 | 5/1976 | Amelio et al. | 307/358 |
| 4,375,037 | 2/1983 | Ikushima | 307/358 |
| 4,375,099 | 2/1983 | Waters et al. | 307/358 |

*Primary Examiner*—John Zazworsky
*Attorney, Agent, or Firm*—James J. Cannon

[57] ABSTRACT

A method of detecting binary information from the pulse-shaped output signal of a CCD uses a varying reference voltage which depends on the amplitude of the last pulse detected, in order to render the detection system immune to pulse distortion as a result of transfer losses in the CCD.

3 Claims, 1 Drawing Sheet

DETECTING BINARY INFORMATION FROM A CHARGE TRANSFER DEVICE

This is a continuation of application Ser. No. 409,206, filed Aug. 18, 1982, now abandoned.

BACKGROUND OF THE INVENTION

1. Field of the Invention

The invention relates to a method of detecting binary information from an output signal of a charge transfer device, which signal comprises a train of pulses, which device is used for temporarily storing or for delaying said binary information in the form of charge packets, the amplitude of said pulses being representative of the binary information and being compared, in a comparator circuit, with a reference signal derived from an output signal of a reference source.

The invention also relates to a device for carrying out the method in accordance with the invention.

2. Description of the Prior Art

A known such method is utilized in existing circuit arrangements, for example the Texas Instruments TMS 364 described on pages 221-225 of the book "Charge Coupled Devices and Systems" by the authors Howes, M.J. and Morgan, D.V. (Published by Wiley & Sons 1979). In accordance with the known method the comparator circuit determines whether the output signal of the charge transfer device is larger or smaller than the reference signal. In the first-mentioned case, for example, a logic "1" will be detected, while in the last-mentioned case this will be a "0".

As is known, charge transfer devices comprise an array of cells arranged in sequence, between which charge transfer is possible under the influence of suitable clock signals. It is also known that such charge transfer devices have the disadvantage that, during transfer of a charge packet from one cell to the following cell, a residual charge is left in the first-mentioned cell, so that, firstly, the charge packet being transferred decreases in magnitude and, secondly, the residual charge is added to the next charge packet. For example, when a charge transfer device is used as a digital shift register, a charge packet representing a logic "0" may be distorted by a charge packet which represents a logic "1" and which directly precedes the first-mentioned charge packet. When the known method is used it may happen that the second charge packet is distorted to such an extent that a logic "1" is detected erroneously. It is obvious that a similar error may occur in the case of a logic "1" which follows a logic "0".

SUMMARY OF THE INVENTION

It is an object of the invention to mitigate the said disadvantage. To this end the method in accordance with the invention is characterized in that in order to generate the reference signal an auxiliary signal is added to the output signal of the reference source, which auxiliary signal depends on the value of the last pulse detected.

By means of the method in accordance with the invention the reference signal is always adapted in such a way that a pulse distorted as a result of the previously described effect still yields the correct binary value upon detection. For carrying out the method in accordance with the invention it is advantageous to employ a device in accordance with the invention. This device is characterized in that it comprises first means for storing the value of the last pulse detected until the instant at which the next pulse is detected, an adder circuit for adding the auxiliary signal to the output signal of the reference source, and second means for deriving the auxiliary signal from the signal stored by the first means and applying said auxiliary signal to the adder circuit.

BRIEF DESCRIPTION OF THE DRAWINGS

The invention will now be described in more detail with reference to the drawing, in which.

DESCRIPTION OF THE PREFERRED EMBODIMENT

Figure 1:
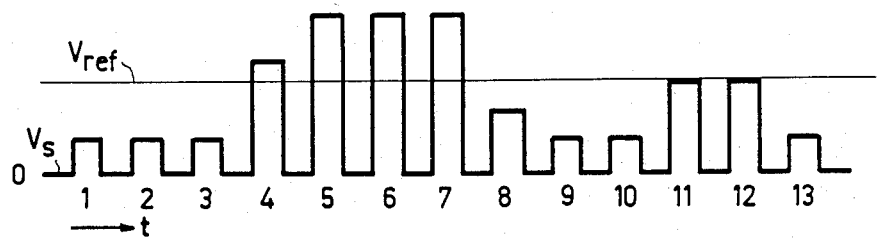
FIG. 1 shows an example of the output signal of the charge transfer device together with the corresponding reference signal employed with the known method.

FIG. 1 shows an example of the variation of the output signal $V_s$ of the charge transfer device together with the corresponding reference signal $V_{ref}$ used in the known method. The reference signal $V_{ref}$ is independent of the output signal $V_s$ of the charge transfer device. The pulses 1, 2, 3 ... 13 each represent binary information. For example, the pulses 1, 2, 3, 8, 9, 10 and 13 each represent a logic "0" and the pulses 4, 5, 6 and 7 a logic "1".

Each time that a transition occurs in the output signal $V_s$ from a logic "0" to a logic "1" and vice versa the pulse appearing at said transition is distorted, as is the case for the pulses 4, 8, 11 and 12. For the pulses 11 and 12 the distortion is so strong that a correct interpretation is unlikely when the known method is used. It will be appreciated that pulse 11 is a distorted "1" pulse, which has degenerated under the influence of preceding "0" pulses, while pulse 12 should have been a "0". Thus, the data smear effect mentioned in the introduction renders the known method unreliable.

The method in accordance with the invention utilizes a reference signal which depends on the amplitude of the last pulse detected.

Figure 2:
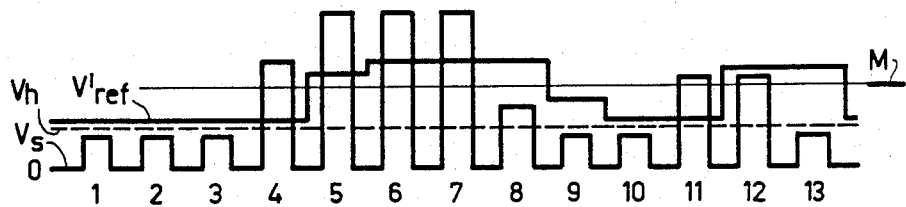
FIG. 2 shows an example of the output signal of the charge transfer device together with the corresponding reference signal employed when using a method in accordance with the invention.

FIG. 2 again shows the variation of the output signal in the same way as in FIG. 1, but now together with the variation of the associated reference signal $V'_{ref}$ when using a method in accordance with the invention. Between the pulses 3 and 4 a transition from logic "0" to logic "1" level occurs, so that in accordance with the inventive method the reference signal $V'_{ref}$ is raised after pulse 4. In the example of FIG. 2 the difference between the reference signal $V'_{ref}$ and the output signal $V_h$ of an auxiliary charge transfer device CA (see FIG. 3) is substantially proportional to the amplitude of the last pulse detected. After the pulse following a transition from logic "1" to logic "0" level the reference signal $V'_{ref}$ is reduced in accordance with the inventive method, as is illustrated for pulse 8. The pulses 11 and 12 are now interpreted correctly despite their substantial distortion.

Figure 3:
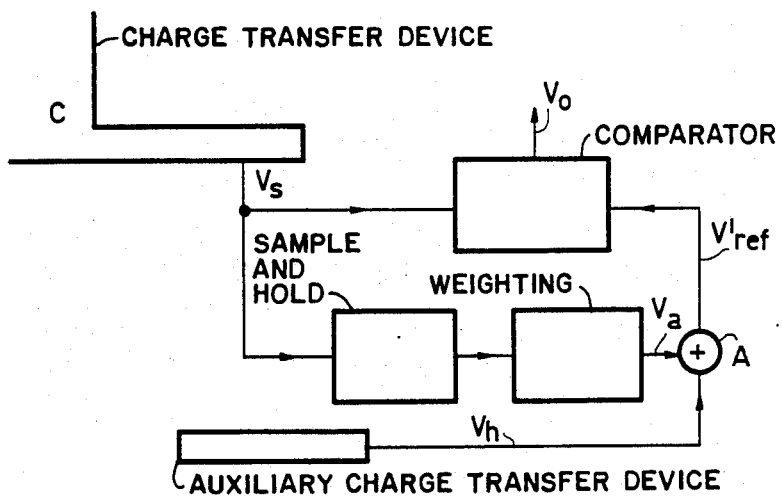
FIG. 3 is the block diagram of a device for carrying out a method in accordance with the invention.

FIG. 3 is the block diagram of a device for carrying out a method in accordance with the invention. The output signal $V_s$ of the charge transfer device C is applied to a comparator circuit D and also to a sample-and-hold circuit SH, which is controlled in synchronism with the clock signal of the charge transfer device C. Thus, the sample-and-hold circuit SH delays the pulses of the output signal $V_s$ for one period of said clock signal. The output signal of the sample-and-hold circuit SH, whose magnitude is equal to the amplitude of the last pulse detected, is applied to an adder circuit A as an auxiliary signal $V_a$ via a weighting - factor or attenuator circuit WF, which adder circuit also receives the output signal $V_h$ of the auxiliary charge transfer device CA. The output signal of the adder circuit A is applied to the comparator circuit D as a reference signal $V'_{ref}$, the output signal $V_o$ of said comparator circuit containing binary information which is represented by the pulses of the output signal $V_s$ of the charge transfer device C.

In order to obtain a suitable reference signal $V'_{ref}$, as is shown in FIG. 2, the output signal $V_h$ of the auxiliary charge transfer device should be so low that after addition to the auxiliary signal $V_a$ a reference signal $V'_{ref}$ is obtained which varies around a reference level M (see FIG. 2) situated half-way between the amplitudes of the largest and the smallest pulses. For this purpose the auxiliary charge transfer device is driven with so-called "fat zeroes", that is charge packets whose levels are slightly above the logic "0" level.

What is claimed is:

1. A method of detecting binary information from an output signal of a charge transfer device, which signal comprises a train of sequential pulses, which device is used for temporarily storing or for delaying said binary information in the form of charge packets, the amplitude of said pulses being representative of the values of the binary information and the amplitude of each of said pulses being compared in sequence in a comparator circuit with a reference signal derived from an output signal of a reference source characterized in that in order to generate said reference signal for each pulse after the first pulse in the sequence an auxiliary signal is added to the output signal of the reference source, which auxiliary signal depends on the binary value of the immediately preceding pulse detected.

2. A device for carrying out a method as claimed in claim 1, characterized in that said device comprises first means for storing the value of the last immediately preceding pulse detected until the instant at which the next pulse succeeding is detected, an adder circuit for adding the auxiliary signal to the output signal of the reference source, and second means for deriving the auxiliary signal from the signal stored by the first means and applying said auxiliary signal to the adder circuit.

3. A device as claimed in claim 2, characterized in that the first means comprise a sample-and-hold circuit having an input and an output, the second means comprise an attenuator circuit, the reference source comprises an auxiliary charge transfer device, the input of the sample-and-hold circuit being connected to an output of the charge transfer device for receiving the output signal of the charge transfer device, the output of the sample-and-hold circuit being connected to a first input of the adder circuit via the attenuator circuit, a second input of the adder circuit being connected to the auxiliary charge transfer device for receiving the output signal of the auxiliary charge transfer device, and an output of the adder circuit being connected to an input of the comparator circuit.

* * * * *